(12) United States Patent
Rothweiler et al.

(10) Patent No.: US 7,071,476 B2
(45) Date of Patent: *Jul. 4, 2006

(54) ILLUMINATION SYSTEM WITH A PLURALITY OF LIGHT SOURCES

(75) Inventors: Dirk Rothweiler, Bangkok (TH); Jörg Schultz, Aalen (DE)

(73) Assignee: Carl Zeiss SMT AG, Oberkocken (DE)

( * ) Notice: Subject to any disclaimer, the term of this patent is extended or adjusted under 35 U.S.C. 154(b) by 242 days.

This patent is subject to a terminal disclaimer.

(21) Appl. No.: 10/429,927

(22) Filed: May 5, 2003

(65) Prior Publication Data

US 2004/0036037 A1 Feb. 26, 2004

Related U.S. Application Data

(63) Continuation of application No. 09/627,559, filed on Jul. 27, 2000, now Pat. No. 6,570,168, which is a continuation-in-part of application No. 10/201,652, filed on Jul. 22, 2002, which is a continuation-in-part of application No. 10/150,650, filed on May 17, 2002, which is a continuation-in-part of application No. 09/679,718, filed on Sep. 29, 2000, now Pat. No. 6,438,199, which is a continuation-in-part of application No. 09/305,017, filed on May 4, 1999, now Pat. No. 6,198,793.

(30) Foreign Application Priority Data

| May 5, 1998 | (DE) | ............................ 198 19 898 |
| Feb. 2, 1999 | (DE) | ............................ 199 03 807 |
| Feb. 8, 1999 | (DE) | ............................ 299 02 108 U |
| Jul. 30, 1999 | (DE) | ............................ 199 35 404 |
| Jul. 28, 2000 | (EP) | ................................ PCT/EP00/07258 |

(51) Int. Cl.
*G21G 5/00* (2006.01)
*G03B 21/28* (2006.01)

(52) U.S. Cl. ............................. 250/492.2; 250/504 R; 250/494.1; 353/37; 353/99

(58) Field of Classification Search .............. 250/492.2, 250/504 R, 494.1; 353/37, 99; 355/66, 67, 355/70

See application file for complete search history.

(56) References Cited

U.S. PATENT DOCUMENTS

| 4,195,913 A | 4/1980 | Dourte et al. ................ 350/292 |
| 4,294,538 A | 10/1981 | Ban ............................. 355/51 |
| 4,389,115 A | 6/1983 | Richter ........................ 355/26 |

(Continued)

FOREIGN PATENT DOCUMENTS

| EP | 0066295 A1 | 12/1982 |
| EP | 0359018 A2 | 3/1990 |
| EP | 0939341 A2 | 9/1999 |
| EP | 1072957 | 7/2000 |
| EP | 1026547 A2 | 8/2000 |
| JP | 403111806 A | 5/1991 |
| JP | 406265887 A | 9/1994 |
| JP | 11044920 A | 2/1999 |

OTHER PUBLICATIONS

W. T. Welford Optics, Third Edition (pp 30–31) Oxford Science Publications; Oxford University Press, 1988.*

Murphy et al., "Synchroton Radiation Sources and Condensers for Projection X–Ray Lithography", Applied Optics, vol. 32, No. 34, pp. 6920–6929 (Dec. 1, 1993).

(Continued)

*Primary Examiner*—John R. Lee
*Assistant Examiner*—James J. Leybourne
(74) *Attorney, Agent, or Firm*—Ohlandt, Greely, Ruggiero, & Perle, LLP (57) ABSTRACT

There is provided an illumination system for EUV-wavelengths. The illumination system includes a plurality of EUV-light sources and an optical unit combining the plurality of EUV-light sources.

43 Claims, 9 Drawing Sheets

U.S. PATENT DOCUMENTS

| | | | |
|---|---|---|---|
| 4,651,012 A | 3/1987 | Clark et al. | 250/505.1 |
| 4,688,932 A | 8/1987 | Suzuki | |
| 4,740,276 A | 4/1988 | Marmo et al. | 204/7 |
| 5,071,240 A | 12/1991 | Ichihara et al. | |
| 5,148,442 A | 9/1992 | O'Neil et al. | 372/71 |
| 5,222,112 A | 6/1993 | Terasawa et al. | 378/34 |
| 5,339,346 A | 8/1994 | White | 378/34 |
| 5,353,322 A | 10/1994 | Bruning et al. | 378/34 |
| 5,361,292 A | 11/1994 | Sweatt | 378/34 |
| 5,402,267 A | 3/1995 | Fürter et al. | 359/727 |
| 5,439,781 A | 8/1995 | MacDowell et al. | 460/311 |
| 5,440,423 A | 8/1995 | Ogura | 359/365 |
| 5,459,547 A | 10/1995 | Shiozawa | |
| 5,512,759 A * | 4/1996 | Sweatt | 250/492.1 |
| 5,581,605 A * | 12/1996 | Murakami et al. | 378/84 |
| 5,647,664 A | 7/1997 | Hanečka | 362/308 |
| 5,669,708 A | 9/1997 | Mashima et al. | 362/341 |
| 5,677,939 A | 10/1997 | Oshino | 378/34 |
| 5,715,084 A | 2/1998 | Takahashi et al. | |
| 5,737,137 A | 4/1998 | Cohen et al. | 359/859 |
| 5,755,503 A | 5/1998 | Chen et al. | 353/38 |
| 5,796,524 A | 8/1998 | Oómura | |
| 5,805,356 A | 9/1998 | Chiba | |
| 5,846,678 A | 12/1998 | Nishigori et al. | |
| 5,896,438 A | 4/1999 | Miyake et al. | 378/34 |
| 5,963,305 A | 10/1999 | Mizouchi | |
| 5,993,010 A | 11/1999 | Ohzawa et al. | 353/99 |
| 5,995,582 A | 11/1999 | Terashima et al. | 378/34 |
| 6,064,072 A * | 5/2000 | Partlo et al. | 250/504 R |
| 6,081,319 A | 6/2000 | Ozawa et al. | |
| 6,195,201 B1 * | 2/2001 | Koch et al. | 359/366 |
| 6,198,793 B1 | 3/2001 | Schultz et al. | |
| 6,208,707 B1 | 3/2001 | Oshino | |
| 6,229,647 B1 | 5/2001 | Takahashi et al. | |
| 6,233,039 B1 | 5/2001 | Yen et al. | |
| 6,236,449 B1 | 5/2001 | Tanitsu | |
| 6,266,389 B1 | 7/2001 | Murayama et al. | |
| 6,268,904 B1 | 7/2001 | Mori et al. | |
| 6,310,679 B1 | 10/2001 | Shiraishi | |
| 6,325,514 B1 * | 12/2001 | Yamamoto | 353/31 |
| 6,335,786 B1 | 1/2002 | Shiraishi | |
| 6,339,467 B1 | 1/2002 | Sato | |
| 6,396,068 B1 * | 5/2002 | Sweatt et al. | 250/504 R |
| 6,400,794 B1 | 6/2002 | Schultz et al. | |
| 6,438,199 B1 | 8/2002 | Schultz et al. | |
| 6,507,440 B1 | 1/2003 | Schultz | |
| 6,583,937 B1 | 6/2003 | Wangler et al. | |
| 6,594,334 B1 | 7/2003 | Ota | |
| RE38,438 E | 2/2004 | Takahashi | |
| 2001/0030740 A1 | 10/2001 | Mori et al. | |
| 2002/0009178 A1 | 1/2002 | Dinger et al. | |
| 2002/0041368 A1 | 4/2002 | Ota et al. | |

OTHER PUBLICATIONS

"Handbook on Synchrotron Radiation", Ernst–Echard Koch ed., pp. 140–145, 1098–1111 (1983).

"The Optics of Spectroscopy", Section 3: "Spectrometer Throughout and Etendue", downloaded from the internet Website: wysiwyg://18/httpwww./jyhoriba.co.uk/jy/oos/oos_ch3.htm.

* cited by examiner

ILLUMINATION SYSTEM WITH A PLURALITY OF LIGHT SOURCES

CROSS-REFERENCE TO RELATED APPLICATIONS

The present application is a continuation of U.S. patent application Ser. No. 09/627,559 filed on Jul. 27, 2000, now U.S. Pat No. 6,570,168, and a continuation in part application of U.S. patent application Ser. No. 10/201,652 filed on Jul. 22, 2002.

The Ser. No. 10/201,652 application is (a) a continuation-in part of U.S. patent application Ser. No. 10/150,650, and (b) a continuation-in part of U.S. patent application Ser. No. 09/679,718. The Ser. No. 10/150,650 application was filed May 17, 2002, and is a continuation-in-part of the Ser. No. 09/679,718 application. The Ser. No. 09/679,718 application was filed Sep. 29, 2000, issued as U.S. Pat. No. 6,438,199, and is a continuation-in-part of U.S. patent application Ser. No. 09/305,017. The Ser. No. 09/305,017 application was filed May 4, 1999, and issued as U.S. Pat. No. 6,198,793. The present application is also claiming priority of (a) International Application No. PCT/EP00/07258, filed Jul. 28, 2000, (b) German Patent Application No. 299 02 108.4, filed Feb. 8, 1999, (c) German Patent Application No. 199 03 807.4, filed Feb. 2, 1999, and (d) German Patent Application No. 198 19 898.1, filed on May 5, 1998, and (e) German Patent Application No. 199 35 404.9, filed on Jul. 30, 1999.

BACKGROUND OF THE INVENTION

1. Field of the Invention

The invention concerns an illumination system for wavelengths $\leq 193$ nm, i.e., VUV and EUV-lithography with a plurality of light sources, for example, as well as a mirror or lens device for producing secondary light sources, comprising several mirrors or lenses, divided into raster elements.

2. Description of the Prior Art

In order to allow even further reduction in the structural width of electronic components, especially to the submicron range, it is necessary to reduce the wavelength of the light used in microlithography.

For wavelengths smaller than 193 nm, lithography with weak x-rays or so-called EUV-lithography is discussed.

A suitable illumination system for EUV-lithography should homogeneously or uniformly illuminate, with as few reflections as possible, a pregiven field for EUV-lithography, especially the annular field of an objective lens, under lithography requirements. Furthermore the pupil of the objective lens should be illuminated up to a particular degree of filling $\sigma$, independently of the field, and the exit pupil of the illumination system should be situated in the entrance pupil of the objective lens.

Regarding the basic layout of EUV-illumination systems, we refer to the applicant's pending applications EP 99 106348.8, submitted on Mar. 2, 1999, entitled "Illumination system, especially for EUV-lithography", U.S. Ser. No. 09/305,017, submitted on May 4, 1999 entitled "Illumination system particularly for EUV-lithography", and PCT/EP 99/02999, submitted on May 4, 1999, entitled "Illumination system, especially for EUV-lithography", whose disclosure contents are incorporated in their entirety in the present application.

The following are discussed herein as light sources for EUV-illumination systems:

- laser plasma sources
- pinch plasma sources
- synchrotron radiation sources

Since light is emitted from these light sources, they are also examples of primary light sources.

In the case of laser plasma sources, an intensive laser beam is focused onto a target (solid, gas jet, droplet). The target is heated so strongly by the excitation that a plasma is formed. This emits EUV-radiation.

Typical laser plasma sources have a spherical beam, i.e., a radiation angle of $4\pi$, as well as a diameter of 50 µm to 200 µm.

In pinch plasma sources, the plasma is produced by means of electrical excitation.

Pinch plasma sources can be described as volume radiators (D=1.00 mm), which emit in $4\pi$, whereby the beam characteristic is dictated by the source geometry.

In the case of synchrotron radiation sources, one can distinguish three types of sources at present:

- bending magnets
- wigglers
- undulators

In bending magnet sources, the electrons are deflected by a bending magnet and emit photon radiation.

Wiggler sources comprise a so-called wiggler for deflection of the electron or an electron beam, and this wiggler comprises a multiple number of alternating polarized pairs of magnets arranged in rows. If an electron passes through a wiggler, it is subjected to a periodic, vertical magnetic field and the electron oscillates in the horizontal plane. Wigglers are also characterized by the fact that no coherency effects occur. The synchrotron radiation produced by a wiggler is similar to a bending magnet and radiates in a horizontal solid angle. In contrast to the bending magnet, it has a flux that is intensified by the number of poles of the wiggler.

There is no clear dividing line between wiggler sources and undulator sources.

In case of undulator sources, the electrons in the undulator are subjected to a magnetic field of shorter period and smaller magnetic field of the deflection poles than in the case of a wiggler, so that interference effects occur in the synchrotron radiation. The synchrotron radiation has a discontinuous spectrum based on the interference effects and emits both horizontally as well as vertically in a small solid-angle element; i.e., the radiation is highly directional.

It is critical for an EUV-illumination system to provide a sufficiently high Lagrange optical invariant or etendu. The Lagrange optical invariant of a system is defined as the product of the illuminated surface times the square of the aperture.

If the numerical aperture in the plane of the wafer is in the range $NA_{wafer}=0.1-0.25$, then in the case of 4:1 systems, a numerical aperture in the reticle plane of $NA_{reticle}=0.025-0.0625$ is needed. If the illumination system is supposed to illuminate this aperture homogeneously and independent from the field up to a filling degree of $\sigma=0.6$, for example, the EUV-source must have the following 2-dim Lagrange optical invariant or etendu: (LC).

$$LC_{ill.}=\sigma^2 LC_{Obj}=0.149 \text{ mm}^2-0.928 \text{ mm}^2$$

The Lagrange optical invariant LC, is generally defined as follows for the lithography system described herein:

$LC_{ill.}=\sigma^2 x \cdot y \cdot NA^2=\sigma^2 A \cdot NA^2$, wherein A is the illuminated area. The area comprises 110 mm×6 mm, for example, in the reticle plane.

The Etendu of a laser plasma source is defined as the product of the illuminated surface of an imaginary unit sphere around the source and the square of the Numerical Aperture at which each field point of the imaginary unit source sees the spherical source.

$$LC = A \cdot NA^2$$

$$A^{LPQ} = 2\pi[\cos(\theta_1) - \cos(\theta_2)] \times (R_{sphere})^2, \text{ with } R_{sphere} = 1 \text{ mm}$$

$$NA \approx r^{LPQ}/R_{sphere} = 0.100$$

where $\theta_1$ is the minimum beam angle with respect to the optical axis and $\theta_2$ is the maximum beam angle with respect to the optical axis $$LC_{LPQ} = 2\pi[\cos(\theta_1) - \cos(\theta_2)] \cdot r^2_{LPQ}$$

With the typical source parameters:
1. $r_{LPQ} = 0.1$ mm, $\theta_1 = 0°$, $\theta_2 = 90°$ yields: $LC_{LPQ} = 0.063$ mm$^2$. This corresponds to 27% of the required value of the Lagrange optical invariant $LC_{ill}$ of, for example, 0.236 mm$^2$.
2. $r_{LPQ} = 0.025$ mm, $\theta_1 0°$, $\theta_2 = 90°$ yields: $LC_{LPQ} = 0.0039$ mm$^2$. This corresponds to 1.7% of the required value of the Lagrange optical invariant of, for example, $LC_{ill} = 0.236$ mm$^2$.

The Lagrange optical invariant $LC_{Pinch}$ of a pinch plasma source with a diameter of 1 mm, $\Omega = 0.3$ sr, for example, is:

$$LC_{Pinch} = A \cdot NA^2 = (\pi \cdot 1 \text{ mm}^2/4) \cdot 0.3053^2 = 0.073 \text{ mm}^2.$$

Thus, the pinch plasma source provides 31% of the required value of the Lagrange optical invariant of, for example, $LC_{ill} = 0.236$ mm$^2$.

The Lagrange optical invariant or Etendu for the undulator source can be estimated by a simplified model assuming a homogeneous two-dimensional radiator with diameter $$\emptyset = 1.0 \text{ mm and aperture } NA_{Und} = 0.001 \text{ with}$$

$$LC_{Und} = A \cdot NA^2$$

$$A_{Und} = \pi \cdot (\emptyset/2)^2$$

$$= 0.785 \text{ mm}^2$$

$$NA_{und} = 0.001$$

as $$LC_{Und} = A \cdot NA^2 = 0.00000079 \text{ mm}^2 = 7.9 \text{ e} - 07 \text{ mm}^2$$

As can be seen from this rough calculation the Etendu or Lagrange optical invariant of the undulator source is much too small in comparison to the required value of the Lagrange optical invariant.

To increase the Lagrange optical invariant, an illumination system comprising a synchrotron radiation source known from U.S. Pat. No. 5,512,759, comprises a condenser system with a plurality of collecting mirrors, which collect the radiation emitted by the synchrotron radiation source and form it to an annular light beam that corresponds to the annular field being illuminated. By this, the annular field is illuminated very uniformly. The synchrotron radiation source has a beam divergence >100 mrad in the plane of radiation.

U.S. Pat. No. 5,439,781 shows an illumination system with a synchrotron radiation source, in which the Lagrange optical invariant, is adjusted by means of a scattering plate in the entrance pupil of the objective lens, wherein the scattering plate can comprise a plurality of pyramidal structures. Also, in U.S. Pat. No. 5,439,781, the synchrotron radiation source has a beam divergence >100 mrad. The synchrotron radiation according to U.S. Pat. No. 5,439,781 is also focused, for example, by means of a collector mirror.

The disclosure contents of both of the above-mentioned documents

U.S. Pat. No. 5,512,759
U.S. Pat. No. 5,439,781 are incorporated into the disclosure contents of the present application by reference.

SUMMARY OF THE INVENTION

The object of the invention is to supply an illumination system of easy construction having the required Etendu in the object—or reticle—plane.

The object of the invention is solved in that several light sources are coupled in order to illuminate the exit pupil of the illumination system up to a predetermined degree of filling.

The coupling of several light sources also results in an increase of intensity. A coupling of several light sources is possible as long as the total Lagrange optical invariant of all coupled sources is less than the Lagrange optical invariant of the illumination system $LC_{ill}$.

There are three basic possibilities for coupling:
1. Addition method: Identical or similar illumination systems are distributed about an axis of the system. The exit pupil of the illumination system is illuminated by the circular pupils of the system parts, which must not overlap. The partial pupils are located on the side face of a pyramid-shaped input mirror, which superimposes the light bundles on the object or reticle.
2. Mixing method: In this case, each system part illuminates the entire exit pupil of the illumination system, but with regions free of light between the secondary light sources. The individual grids of the secondary light sources are staggered by superimposing, so as to uniformly fill the pupil. The coupling mirror consists of a raster element plate, whose raster elements or facets have the shape of pyramids. Each side face of an individual raster element pyramid is illuminated by a secondary light source.
3. Segment method: Similar to the addition method. Unlike the addition method, a segment of any desired shape is illuminated by appropriate beam deflection, instead of a circular segment of the exit pupil.

Preferred embodiments of the invention making use of at least one of the above-mentioned methods are the subject of the subsidiary claims.

DESCRIPTION OF THE DRAWINGS

The invention shall now be described by means of the drawings.

DETAILED DESCRIPTION OF THE INVENTION

Figure 1:
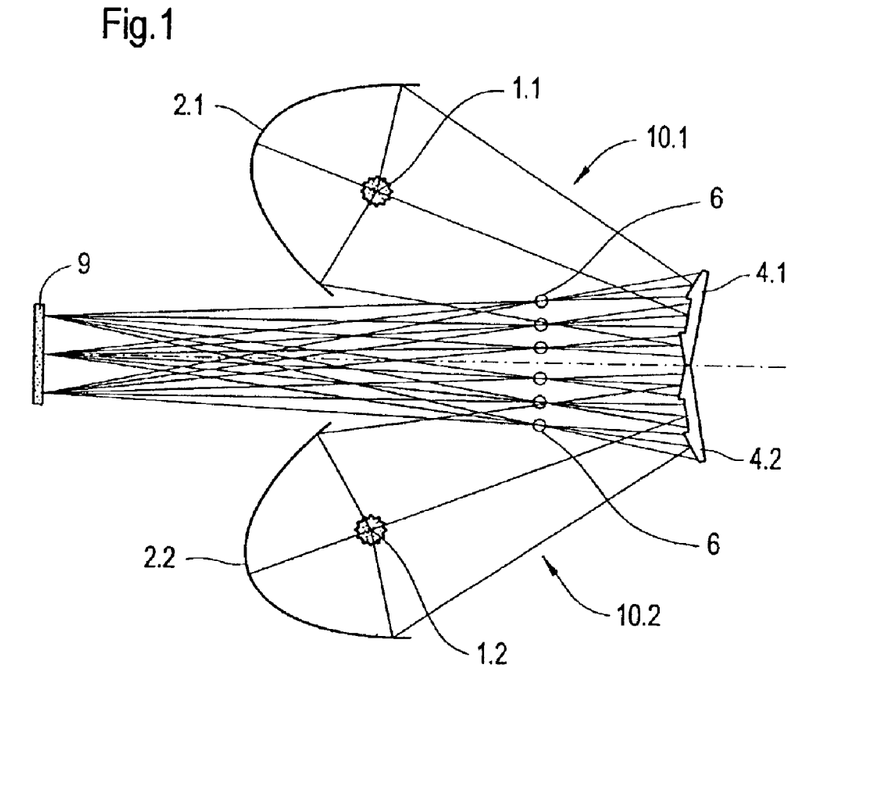
FIG. 1 shows a first embodiment of the invention, in which the light of several light sources is superimposed according to the addition method.

FIG. 1 shows the layout of a system in which the light sources are coupled together according to the addition method. The light sources 1.1, 1.2 in the present case have a small source diameter, in this case laser plasma sources are further investigated.

Regarding the basic layout of EUV-illumination systems, we refer to the applicant's pending applications EP 99 1 06348.8, submitted on Mar. 2, 1999, entitled "Illumination system, especially for EUV-lithography", U.S. Ser. No. 09/305,017, submitted on May 4, 1999, entitled "Illumination system particularly for EUV-lithography", now U.S. Pat. No. 6,198,793 B1, and PCT/EP 99/02999, submitted on May 4, 1999, entitled "Illumination system, especially for EUV-lithography", whose disclosure contents are incorporated in their entirety in the present application.

Each system part 10.1, 10.2 is essentially identical in construction and comprises a light source 1.1, 1.2, a collector mirror 2.1, 2.2, and a field raster element plate 4.1, 4.2.

The light of each source is collected by means of the collector mirror assigned to a particular source and transformed into a parallel or convergent light bundle. The field raster elements of the particular field raster element plate 4.1, 4.2 decompose the light bundle and create secondary light sources 6 in the diaphragm plane of the illumination system. These secondary light sources are imaged by the field lens (not shown) or field mirror in the exit pupil of the illumination system, which is the entrance pupil of the objective lens (not shown). The field raster elements of the field raster element plate are arranged on the plate and oriented so that the images of the field raster elements are superimposed in the reticle plane 9.

The systems are brought together where the field raster element plates are located. The field raster element plates are located on a pyramid, the number of the sides of the pyramid corresponds to the number of coupled partial systems. The angle of inclination of the pyramid sides is chosen such that the illuminated fields of the partial systems in the reticle plane 9 are superimposed.

The partial systems parts 10.1, 10.2 are arranged such that their partial pupils fill the diaphragm plane of the illumination system optimally.

In the embodiment shown in the drawings, the partial systems are oriented such that they possess a common system axis. The angular spacing of the partial system is then 360°/number of systems.

Figure 2:
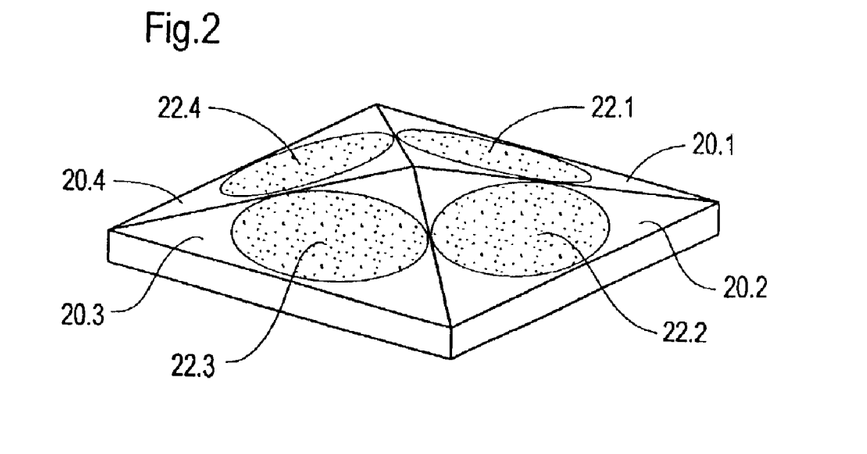
FIG. 2 shows the arrangement of the raster element field plates on an equilateral pyramid.

For four partial systems, FIG. 2 shows the illumination of the pyramid, on each of the four lateral surfaces 20.1, 20.2. 20.3, 20.4 of the pyramid one field raster element plate of a partial system in the area of the illuminated surface 22.1, 22.2, 22.3, 22.4 is arranged.

The field raster elements are arranged and oriented such that the images of the field raster elements overlap in the reticle plane 9. The angle of inclination of the pyramid surfaces 20.1, 20.2. 20.3, 20.4 is chosen such that the illuminated fields of the partial system superimpose in the reticle plane.

Figure 3:
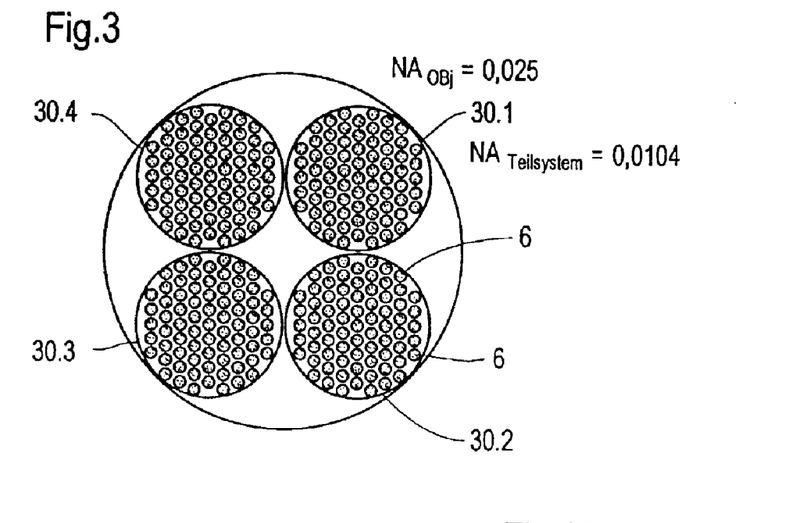
FIG. 3 shows the illumination of the exit pupil of a system according to FIG. 1.
Figures 4A, 4B:
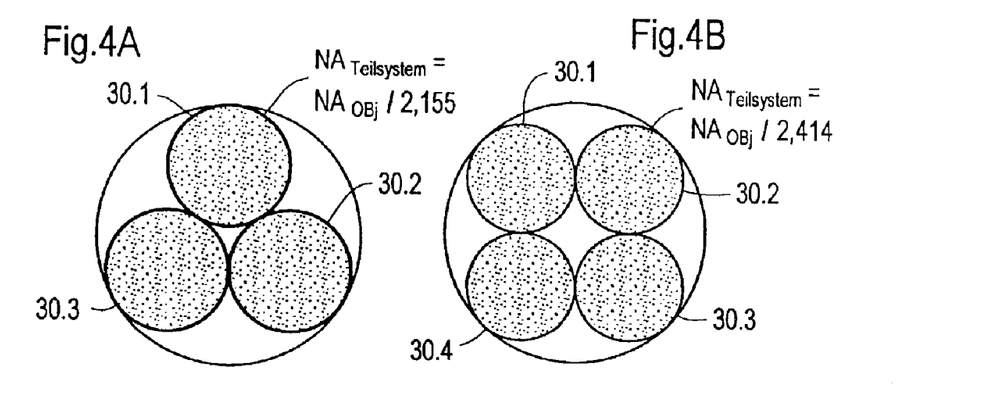
FIGS. 4A–4D show illumination of the exit pupil with coupling of 3, 4, 5 and 6 sources.
Figures 4C, 4D:
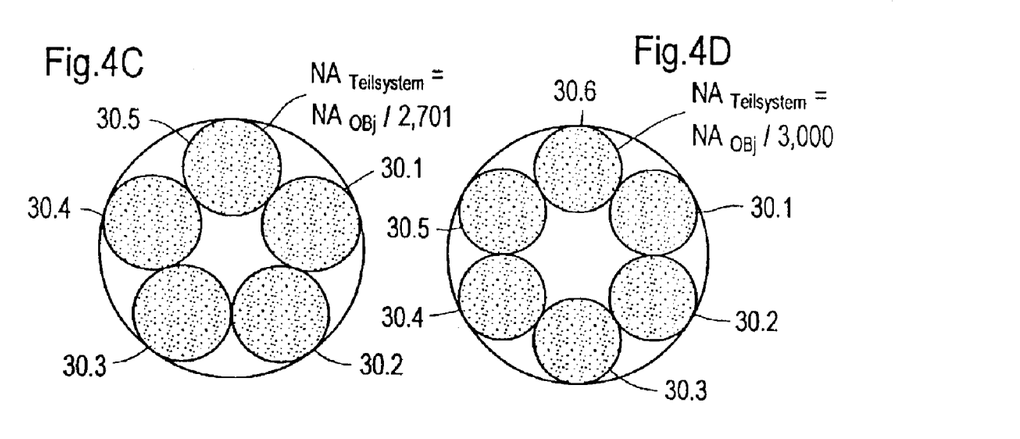

The illumination in the diaphragm plane is provided by four circular partial pupils 30.1, 30.2. 30.3, 30.4, as shown in FIG. 3, which in turn are divided into individual secondary light sources 6, corresponding to the number of illuminated field raster elements of the field raster element plates.

In FIG. 3, the aperture of the total system is $NA_{Obj}$=0.025 and the aperture of the system parts is $NA_{Teilsystem}$=0.0104.

Depending on the number of coupled partial systems, one can imagine the arrangement and symmetries of the partial pupils 30.1, 30.2. 30.3, 30.4, 30.5, 30.6 as shown in FIGS. 4A through 4D with coupling of 3, 4, 5 and 6 sources.

The maximum diaphragm diameters of the partial systems are derived from the total aperture $NA_{Obj}$ of the objective lens in the diaphragm plane and the number of partial systems or subsystems.

$$NA_{Teilsystem} = \frac{NA_{Obj}}{1 + \frac{1}{\sin\left(\frac{\pi}{Anzahl}\right)}}$$

Whereby:

Teilsystem=partial system; Anzahl=number of partial systems

When the pupil of each subsystem is filled, the pupil can be illuminated to η% of the maximum.

$$\eta = Anzahl \cdot \frac{1}{\left(1 + \frac{1}{\sin\left(\frac{\pi}{Anzahl}\right)}\right)^2}$$

Whereby:

Anzahl=number of partial systems

The following table gives $NA_{system\ part}$ and the filling factor η for $NA_{Obj}$=0.025:

| Number of system parts | $NA_{system\ parts}$ | Filling factor $\eta_{max}$ |
| --- | --- | --- |
| 2 | 0.0125 | 0.500 |
| 3 | 0.0116 | 0.646 |
| 4 | 0.0104 | 0.686 |
| 5 | 0.0093 | 0.685 |
| 6 | 0.0083 | 0.667 |
| 7 | 0.0076 | 0.641 |
| 8 | 0.0069 | 0.613 |
| 9 | 0.0064 | 0.585 |
| 10 | 0.0059 | 0.557 |

Hence, the maximum attainable filling factor with the addition method using four subsystems and $NA_{Obj}$=0.025 is achieved with $\eta_{max}$≈0.69. As a boundary condition, the overall Etendu of the coupled sources may not exceed the system Etendu $LC_{ill}=\eta_{max} \cdot LC_{Obj}$; thus, we must always have:

$$\Sigma LC_i \leq LC_{ill}$$

all sources

Figure 5:
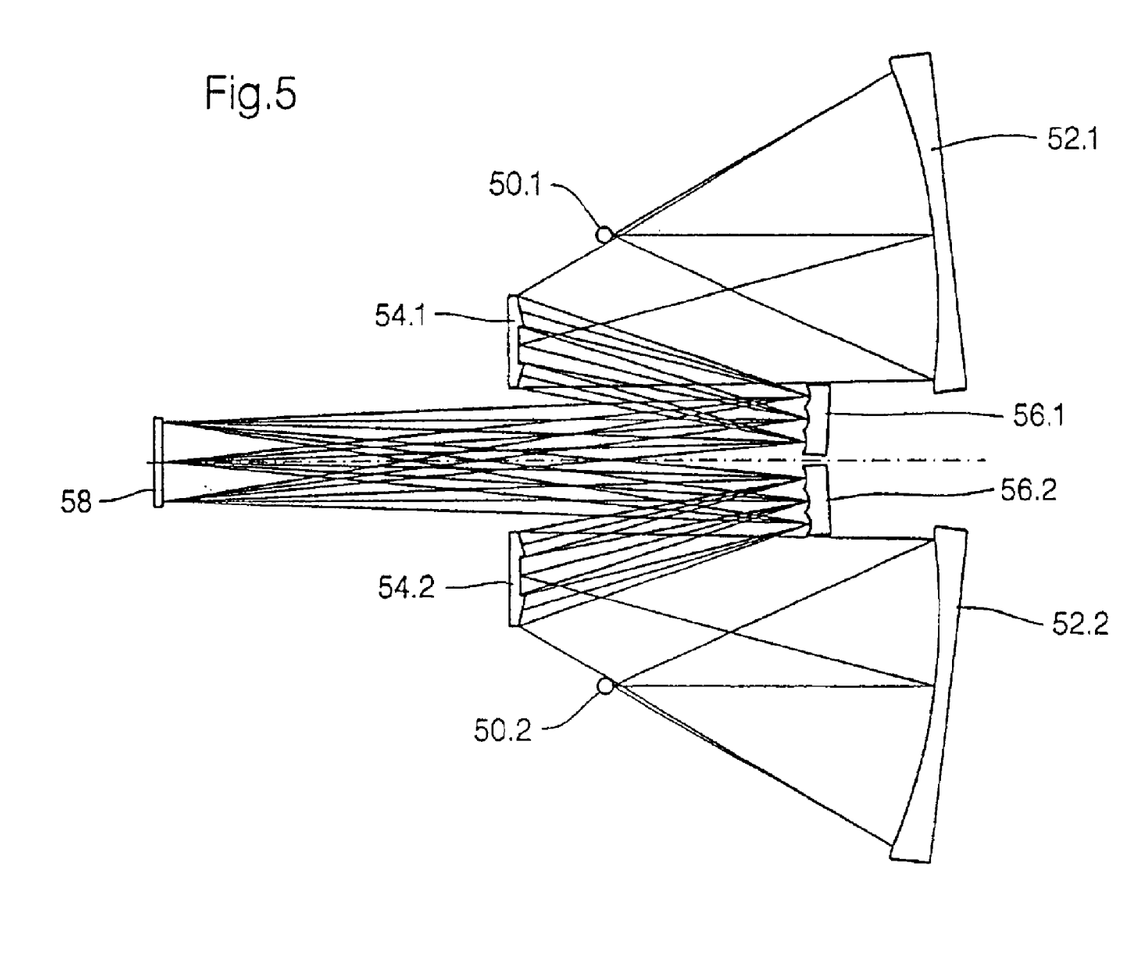
FIG. 5 shows a second embodiment of the invention, in which the light of several light sources is coupled by the addition method in the diaphragm plane.

FIG. 5 shows a second form of embodiment of the invention, in which the light sources 50.1, 50.2 are pinch plasma sources, for example. The pinch plasma sources 50.1, 50.2 are also denoted as primary light sources. The source diameter of the pinch plasma sources is not negligible.

A partial illumination system with pinch plasma source comprises the light source 50.1, 50.2, a collector mirror 52.1, 52.2, which collects the light and illuminates the field raster element plate 54.1, 54.2. The field raster elements of the plate produce secondary light sources. At the location of the secondary light sources, the pupil raster elements are arranged on a pupil raster element plate. The field raster elements of the field raster element plate are used to shape the field and the pupil raster element of the pupil raster element plate correctly image the field raster element in the reticle plane. Preferably, each field raster element is assigned to a pupil raster element. The light is guided by reflection from the field raster elements of the field raster element plates to the pupil raster element of the pupil raster element plate 56.1, 56.2 and from there to the reticle, or object 58.

The systems are brought together at the location of the pupil raster element plates. The pupil raster element plates are located on a pyramid. The number of sides of the pyramid corresponds to the number of coupled subsystems. The angle of inclination of the pyramid sides is chosen such that the illuminated fields of the partial systems or subsystems are brought together in the reticle plane.

If the subsystems have a common system axis, then the angular spacing of the system parts is 360°/number of systems and the pupil raster element plates of the subsystem are preferably arranged on the lateral surfaces of a pyramid, as shown in FIG. 2.

The advantage of the addition method of coupling is that identical or similar illumination systems can be coupled together. The raster element plates of the subsystems are separate and can thus be fabricated separately.

In the addition method, it should be noted that intensity differences of the individual sources are directly passed on to the illumination of the pupils, and thus the intensity of the partial pupils is dictated by the source power.

The intensity distribution in the diaphragm plane becomes independent of the intensities of the individual sources if one mixes the secondary light sources in the pupil plane. This technique is also hereafter designated as the mixing method.

Whereas in the addition method the beam bundles of each source only penetrate after passing through the diaphragm plane, in the mixing method the beam bundles penetrate in front of the diaphragm plane and are mixed in the diaphragm plane. The maximum aperture for each subsystem is adapted to the desired angle of filling of the objective aperture. As in the addition method, systems of identical construction can be coupled together for the individual sources. They are uniformly arranged about a common system axis. The systems are coupled together in the plane of the secondary light sources.

Figure 6:
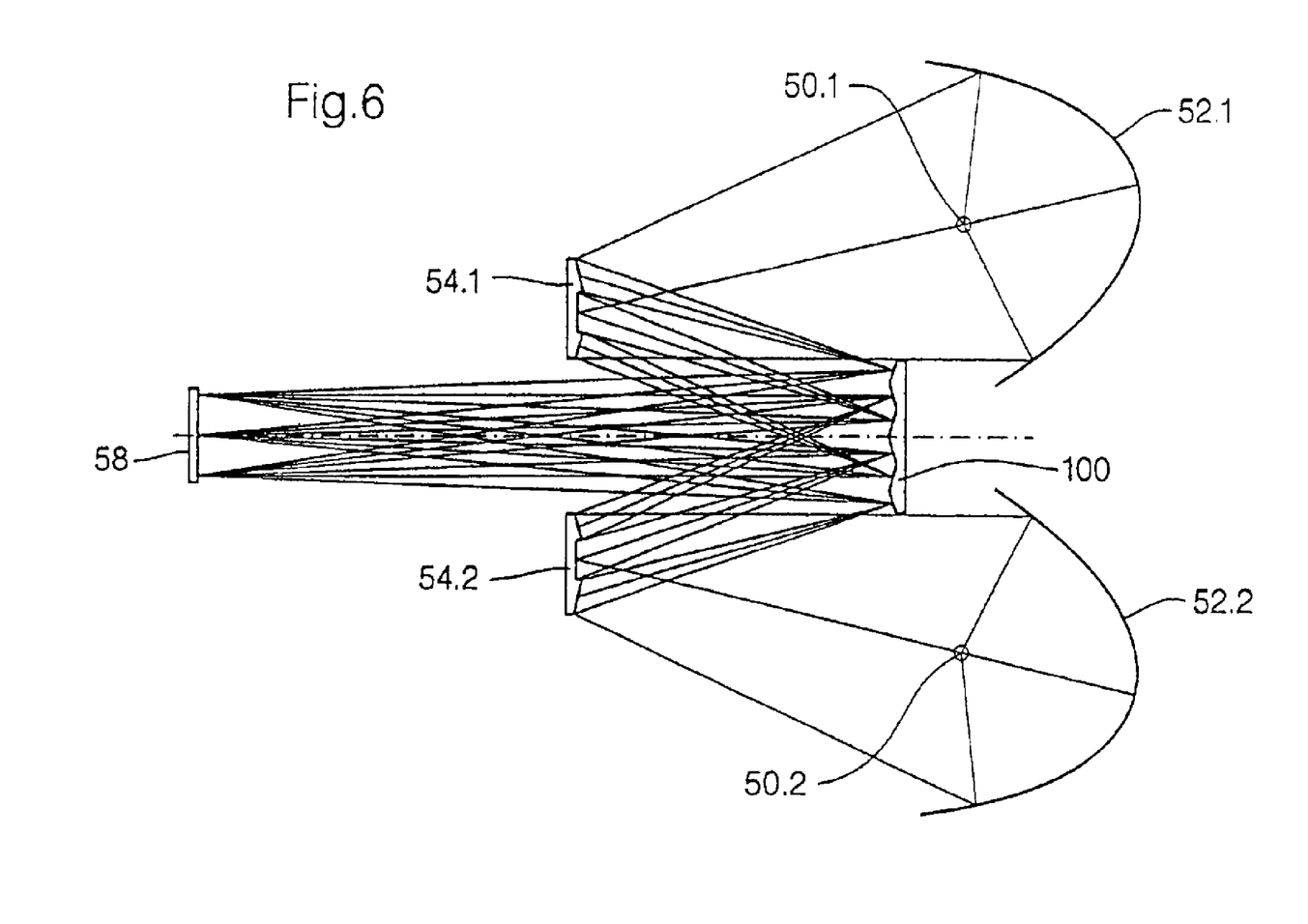
FIG. 6 shows a third embodiment of the invention, in which the light of several light sources is coupled by the mixing method in the diaphragm plane.

FIG. 6 shows an illumination system based on the mixing method for coupling of several light sources.

The light sources once again are laser plasma sources. The same components as in FIG. 5 are designated with the same reference numbers. In contrast to FIG. 5, for example, there is a single pupil raster element plate 100, which includes a plurality of pyramids. The pupil raster element plate 100 is arranged at the location of the secondary light sources, which are produced by the field raster elements. A secondary light source is located on each flank, or lateral side, of the plurality of pyramids.

Figure 7:
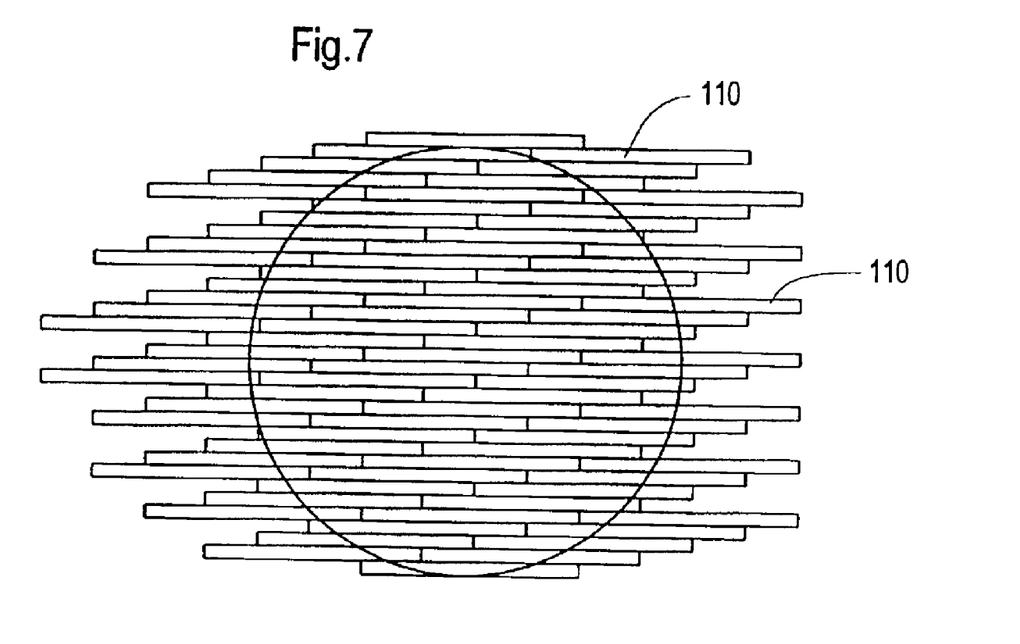
FIG. 7 shows arrangement of the field raster elements on the field raster element plates of a system according to FIG. 6.

The schematic representation of FIG. 7 shows a typical arrangement of the field raster elements 110 on the field raster element plate. Each field raster element plate produces a grid of secondary light sources in the diaphragm plane. The distribution of the secondary light sources in the diaphragm plane corresponds to the arrangement of the field raster elements.

Figure 8:
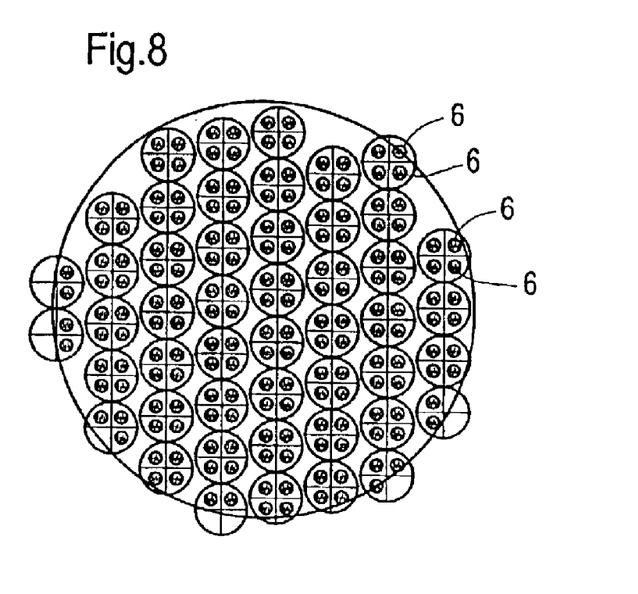
FIG. 8 shows arrangement of the secondary light sources in the diaphragm plane of a system according to FIG. 6.

By shifting the subsystems, as depicted in FIG. 8, the grids of secondary light sources can be brought to be located next to each other, corresponding to the number of subsystems.

Figure 9:
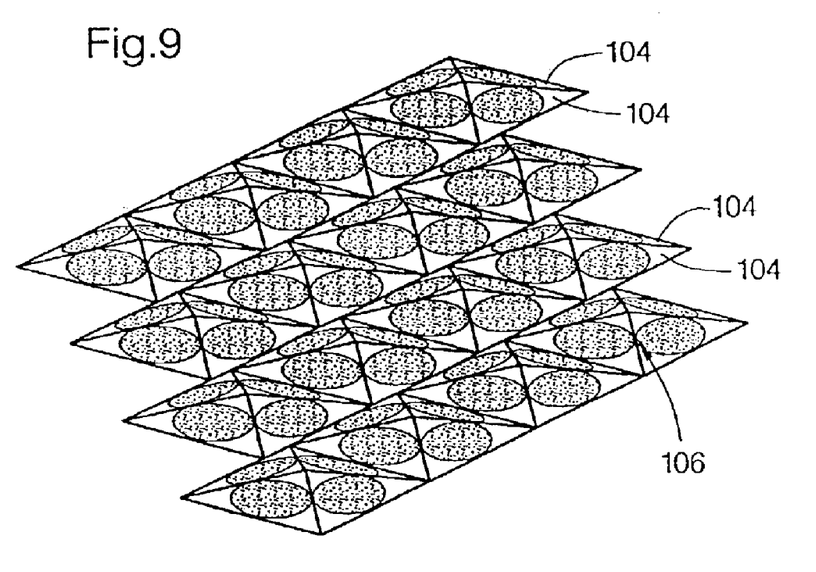
FIG. 9 shows segment of the pupil raster element plate of a system according to FIG. 6 with a plurality of pyramids, on whose flanks the pupil raster elements are located.

If four sources are coupled together, the arrangement of secondary light sources 6 shown in the schematic representation of FIG. 8 is obtained. For the correct superimposing of the four subsystems, each set of secondary light sources is located on a mirrored pyramid. The flanks of the pyramid are inclined such that the images of the field raster elements are superimposed in the reticle plane. The schematic representation of FIG. 9 shows a segment of the pupil raster element plate. One clearly recognizes the individual pupil raster elements 104 that are formed by the flanks of an equilateral pyramid 106.

If the Etendu (LC) of the individual sources is small, the pupil raster elements can be designed as plane mirrors, i.e., the flanks of the equilateral pyramids 106 are planar.

When the source diameter is not negligible, such as with pinch plasma sources, the pupil raster elements 104 must image the field raster elements in the object plane, for example, the reticle plane. In this case, a concave mirror surface 108, as shown in FIG. 10, must be worked into the pyramid flanks.

Figure 10:
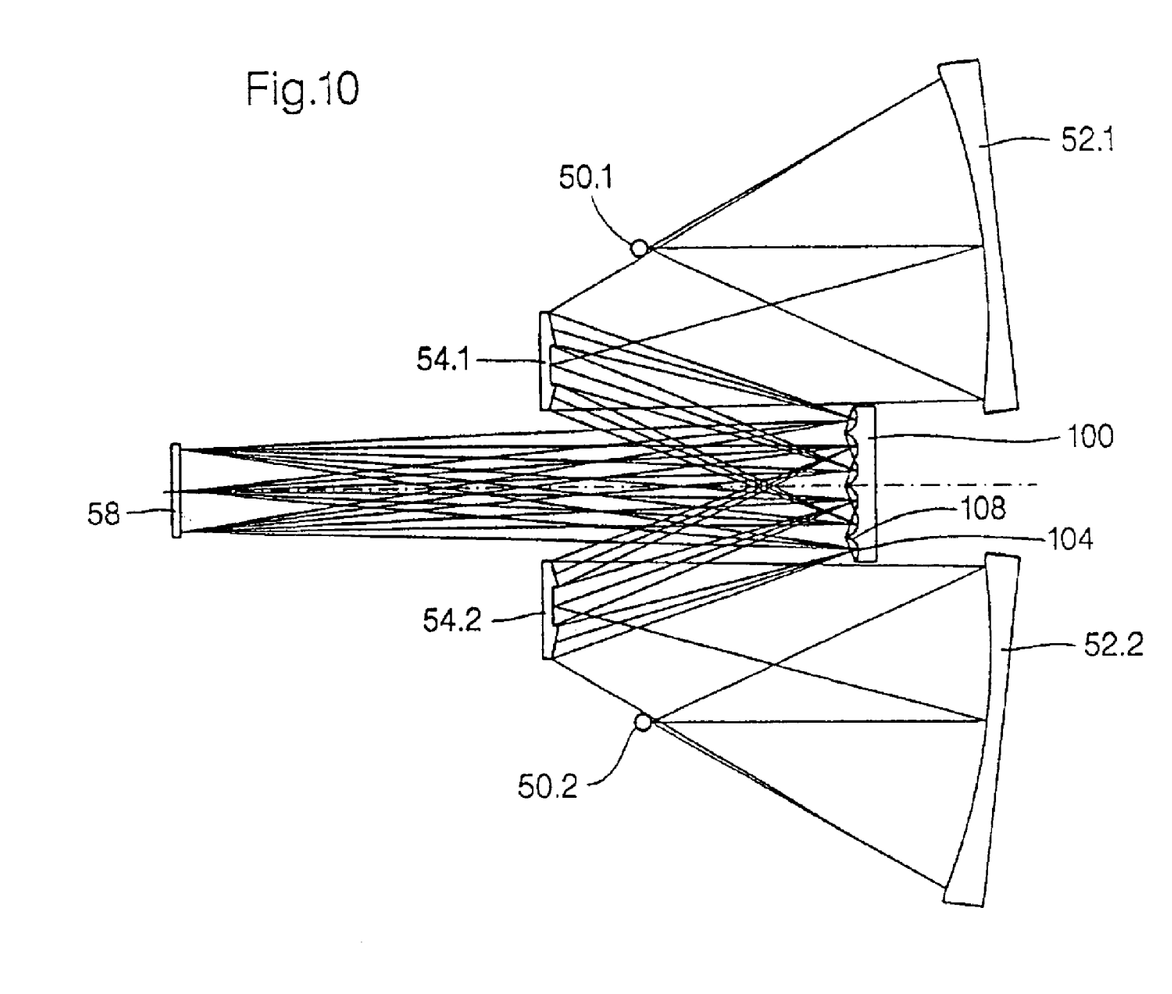
FIG. 10 shows a fourth embodiment of the invention, in which light from several light sources is coupled in the diaphragm plane by means of imaging raster elements according to the mixing method.

The schematic representation of FIG. 10 shows a system in which several pinch plasma sources are coupled with a pupil raster element plate comprising pupil raster elements with concave surfaces. The same components as in FIG. 6 are given the same reference numbers.

The examples shown in FIGS. 5 through 10 are designed for four coupled sources. However, the same method can be used for three, five, six or more sources. The grids should then be shifted such that the secondary light sources are located on the side faces of pyramids. The degree of filling of the pupil is limited similar to the addition method.

The advantages of the mixing method are that the individual sources are mixed in the pupil plane. Fluctuations in source intensity are not shown in the pupil as inhomogeneous pupil illumination. Furthermore, the system pupil can be filled more uniformly with secondary light sources.

As a third method of coupling several light sources together, the segment method shall be described.

Figure 11:
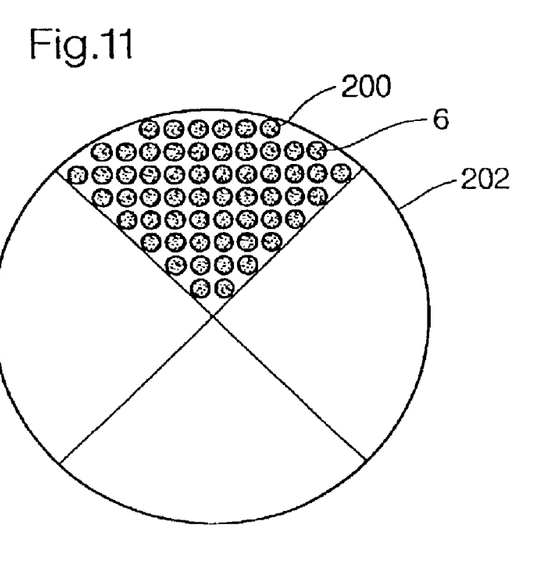
FIG. 11 shows illumination of a segment of the pupil raster element plate in a system that operates according to the segment method.

The segment method works similar to the addition method. The coupled illumination systems are uniformly distributed about a common system axis. Each system has a corresponding segment to fill the diaphragm plane. Instead of filling this segment with a circle as in the addition method, one can uniformly fill up the segment by orienting the field raster elements on the field raster element plate. FIG. 11 shows the illumination of one of four segments 200 of the system pupil 202, when four sources are coupled together. In segment 200 secondary light sources 6 corresponding to the number of illuminated field raster elements are formed.

In order for the individual light bundles to be correctly superimposed in the reticle plane, pupil raster elements must be arranged at the location of the secondary light sources, which deflect the light bundles so that the images of the field raster elements are superimposed in the reticle plane. Depending on the size of the source, the pupil raster elements have planar surfaces for point like sources or concave surfaces for extended sources. Accordingly, field and pupil raster elements are tilted individually and without symmetry.

The advantage of the segment method is the optimal filling of the diaphragm plane with secondary light sources 6 by a pairwise tilting of field and pupil raster elements.

Figure 12:
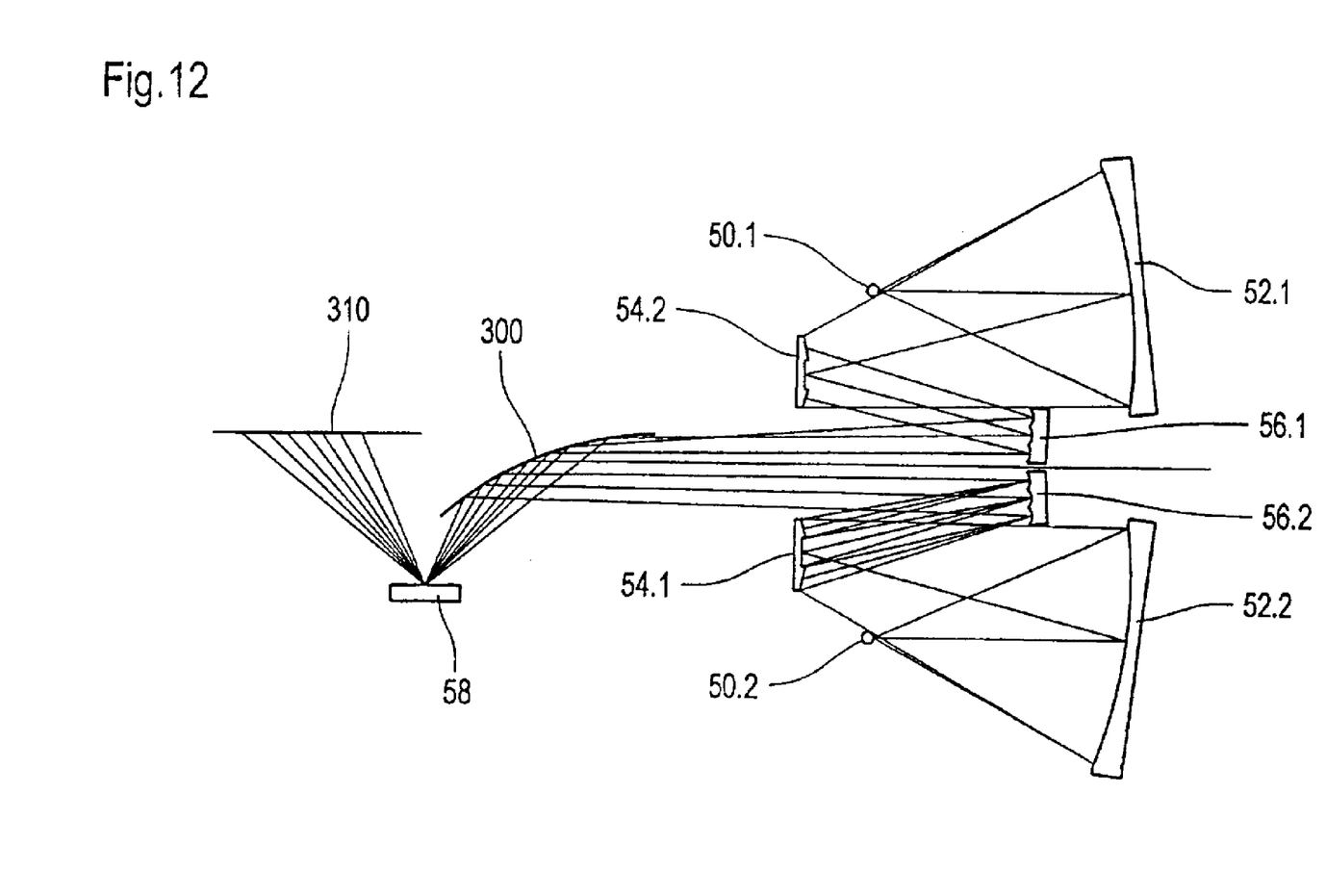
FIG. 12 shows the illumination system of the second embodiment wherein a field lens is situated in a light path between the plurality of secondary light sources and the reticle plane and some rays are drawn from the two light sources to the exit pupil.

Although no optical components have been depicted in the preceding examples of embodiments of the illumination systems after the lenses or mirrors with raster elements, it is obvious to the person skilled in the art that field lenses or field mirrors must be provided after the lenses or mirrors with raster elements in order to shape the annular field in the reticle plane and to image the diaphragm plane into the exit pupil of the illumination system, for example. This is shown in FIG. 12. The illumination system of the second embodiment, shown in FIG. 5 was adapted by introducing a field lens 300 between the pupil raster element plates 56.1 and 56.2. The field lens 300 represents an optical unit, which can also comprise two or more mirrors. The field lens 300 images the plurality of secondary light sources formed on the pupil raster element plates 56.1 and 56.2 into the exit pupil 310. In this regard, concerning the basic layout of EUV illumination systems, refer to the applicant's pending applications EP 99 1 06348.8, submitted on Mar. 2, 1999, entitled "Illumination system, especially for EUV-lithography", U.S. Ser. No. 09/305,017, submitted on May 4, 1999 entitled "Illumination system particularly for EUV-lithography", and PCT/EP 99/02999, submitted on May 4, 1999, entitled "Illumination system, especially for EUV-lithography", whose disclosure contents are incorporated in their entirety in the present application.

Figure 13:
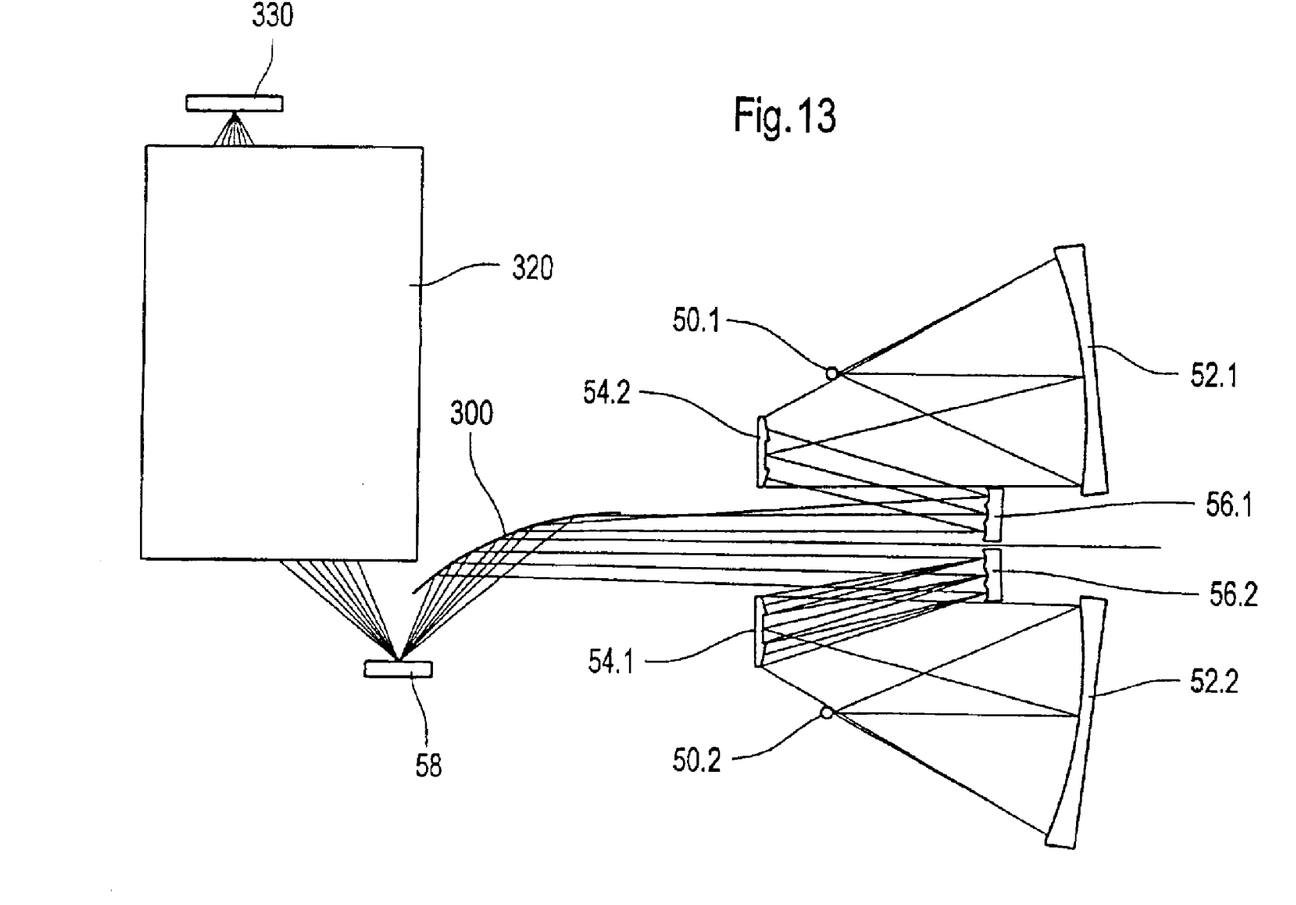
FIG. 13 shows a projection exposure system with the illumination system of FIG. 12.

An EUV-projection exposure system is shown in FIG. 13. The illumination system is already shown in FIG. 12. The reticle 58 is imaged by the projection objective lens 320 onto the wafer 330. The EUV-projection exposure system can be realized as a stepper or scanning system.

What is claimed is:

1. An illumination system for EUV-wavelengths, comprising:
   a plurality of primary EUV-light sources from which a plurality of light paths originates; and
   an optical unit, situated in said plurality of light paths, that combines light from said plurality of EUV-light sources.

2. The illumination system of claim 1, wherein said optical unit comprises a reflective element.

3. The illumination system of claim 1, wherein each of said plurality of EUV-light sources has a collector mirror assigned thereto.

4. The illumination system of claim 1, wherein said optical unit combines light from more than two of said plurality of EUV-light sources.

5. The illumination system of claim 1, wherein said optical unit combines light from three of said plurality of EUV-light sources.

6. The illumination system of claim 1, wherein said optical unit combines light from four of said plurality of EUV-light sources.

7. The illumination system of claim 1, wherein said optical unit combines light from five of said plurality of EUV-light sources.

8. The illumination system of claim 1, wherein said optical unit combines light from six of said plurality of EUV-light sources.

9. The illumination system of claim 1, wherein said plurality of EUV-light sources includes a laser plasma source.

10. The illumination system of claim 1, wherein said plurality of EUV-light sources includes a pinch plasma source.

11. The illumination system of claim 1, wherein said plurality of EUV-light sources includes a synchrotron radiation source.

12. The illumination system of claim 1,
   wherein each of said plurality of EUV-light sources has a Lagrange optical invariant, and
   wherein said optical unit combines said light from said plurality of EUV-light sources so that a total Lagrange optical invariant is achieved.

13. The illumination system of claim 1,
   wherein each of said plurality of EUV-light sources has a Lagrange optical invariant, and
   wherein a maximum number of said plurality of EUV-light sources coupled by said optical unit is determined by the condition:

$$\Sigma LC_i \leq LC_{ill}$$

all sources
   with $Lc_i$=Lagrange optical invariant of an $i^{th}$ member of said plurality of EUV-light sources,
   and $LC_{ill}$=Lagrange optical invariant of said illumination system.

14. An EUV-projection exposure system comprising:
   said illumination system of claim 1;
   a plane illuminated by said illumination system for accommodating a mask;
   a projection objective lens; and
   a carrier system for accommodating a light-sensitive object, wherein an image of said mask is formed on said light-sensitive object.

15. An EUV-projection exposure system of claim 14, wherein said optical unit combines said light from said plurality of EUV-light sources so that a pupil of said projection objective lens is illuminated up to a predetermined degree of filing.

16. A method for production of microelectronic components, comprising using said EUV-projection exposure system of claim 15.

17. An illumination system for wavelengths $\leq 193$ nm, comprising:
   a plurality of primary light sources; and
   an optical unit that combines light from said plurality of primary light sources so that an increase of intensity is achieved.

18. An illumination system having a first Lagrange optical invariant for wavelengths $\leq 193$ nm, comprising:
   a plurality of primary light sources, wherein each of said plurality of primary light sources has a second Lagrange optical invariant; and
   an optical unit that combines light from said plurality of primary light sources so that a sum of said second Lagrange optical invariants is less than or equal to said first Lagrange optical invariant.

19. The illumination system of claim 18, wherein a maximum number of said plurality of primary light sources providing light combined by said optical unit is determined by the condition:

$$\Sigma LC_i \leq LC_{ill}$$

all sources
   with $LC_i$=Lagrange optical invariant of an $i^{th}$ member of said plurality of primary light sources, and
   $LC_{ill}$=Lagrange optical invariant of said illumination system.

20. The illumination system of claim 18,
   wherein said illumination system further comprises a first plurality of raster elements transforming said plurality of primary light sources into a plurality of secondary light sources, and wherein said first plurality of raster elements is imaged into a plane to form a plurality of images.

21. The illumination system of claim 20, wherein each of said first plurality of raster elements has a concave surface.

22. The illumination system of claim 20, wherein each of said first plurality of raster elements has a planar surface, wherein said illumination system further comprises a collector unit, and wherein said first plurality of raster elements transforms said plurality of primary light sources into said plurality of secondary light sources.

23. The illumination system of claim 20, wherein each of said first plurality of raster elements is arranged and oriented to superimpose said plurality of images in said plane to form an illuminated field.

24. The illumination system of claim 20, further comprising a second plurality of raster elements.

25. The illumination system of claim 24, wherein said second plurality of raster elements is located at said plurality of secondary light sources, wherein each of said plurality of secondary light sources is located on one of said second plurality of raster elements, and wherein each of said first plurality of raster elements and each of said second plurality of raster elements are arranged and oriented to superimpose said plurality of images in said plane to form an illuminated field.

26. The illumination system of claim 24, wherein each of said second plurality of raster elements has a concave surface.

27. The illumination system of claim 24, wherein each of said second plurality of raster elements has a planar surface.

28. The illumination system of claim 24, further comprising an optical element and an exit pupil, wherein said optical element is situated in an optical light path between said plurality of secondary light sources and said plane, to image said plurality of secondary light sources into said exit pupil.

29. The illumination system of claim 18, further comprising a collector unit.

30. The illumination system of claim 29, wherein said collector unit comprises a plurality of collector elements assigned to each of said plurality of primary light sources.

31. The illumination system of claim 30, wherein said plurality of collector elements includes a collector mirror.

32. A projection exposure system comprising:

said illumination system of claim 18;

a plane illuminated by said illumination system for accommodating a mask;

a projection objective lens; and a carrier system for accommodating a light-sensitive object, wherein an image of said mask is formed on said light-sensitive object.

33. A method for production of microelectronic components, comprising of using said projection exposure system of claim 32.

34. A projection exposure apparatus comprising:

an illumination system for wavelengths $\leq 193$ nm, wherein said illumination system comprises a plurality of primary light sources and an optical unit;

a plane illuminated by said illumination system for accommodating a mask;

a projection objective lens, wherein said optical unit combines light from said plurality of primary light sources so that a pupil of said projection objective lens is illuminated up to a predetermined degree of filing; and a carrier system for accommodating a light-sensitive object, wherein an image of said mask is formed on said light-sensitive object.

35. The projection exposure apparatus according to claim 34, wherein said plurality of primary light sources are EUV-light sources.

36. The projection exposure apparatus according to claim 34, wherein said optical unit comprises a reflective element.

37. A method for production of microelectronic components, comprising using said projection exposure apparatus of claim 34.

38. An illumination system for EUV-wavelengths, comprising:

a plurality of EUV-light sources;

an optical unit that combines light from said plurality of EUV-light sources;

a plurality of raster elements, situated in a light path downstream of said optical unit, for producing secondary light sources, wherein said plurality of raster elements is imaged into a field plane to form a plurality of images that are superimposed to form an illuminated field.

39. The illumination system of claim 38, wherein each of said plurality of EUV-light sources has a Lagrange optical invariant, and wherein a maximum number of said plurality of EUV-light sources coupled by said optical unit is determined by the condition:

$$\Sigma LC_i \leq LC_{ill}$$

all sources with $LC_i$=Lagrange optical invariant of an $i^{th}$ member of said plurality of EUV-light sources, and $LC_{ill}$=Lagrange optical invariant of said illumination system.

40. An illumination system for wavelengths $\leq 193$ nm, comprising:

a plurality of primary light sources, wherein each of said plurality of primary light sources has a Lagrange optical invariant; and an optical unit that combines light from said plurality of primary light sources so that a total Lagrange optical invariant is achieved being less than or equal to a Lagrange optical invariant of said illumination system.

41. The illumination system of claim 40, wherein said optical unit combines said light from said plurality of light sources so that a pupil of a projection objective lens is illuminated up to a predetermined degree of filing.

42. The illumination system of claim 40, wherein said plurality of light sources comprises a source selected from the group consisting of a laser plasma source or a pinch plasma source.

43. The illumination system of claim 40, further comprising:

a plane illuminated by said illumination system for accommodating a mask;

a projection objective lens; and a carrier system for accommodating a light-sensitive object, wherein an image of said mask is formed on said light-sensitive object.

* * * * *